US 6,705,001 B2

(12) United States Patent
How et al.

(10) Patent No.: US 6,705,001 B2
(45) Date of Patent: Mar. 16, 2004

(54) APPARATUS FOR ASSEMBLING INTEGRATED CIRCUIT PACKAGES

(75) Inventors: Wee Kiun How, Singapore (SG); Jian Zhang, Singapore (SG); Lian Hok Tan, Singapore (SG)

(73) Assignee: ASM Technology Singapore PTE Ltd. (SG)

( * ) Notice: Subject to any disclaimer, the term of this patent is extended or adjusted under 35 U.S.C. 154(b) by 61 days.

(21) Appl. No.: 09/996,210

(22) Filed: Nov. 28, 2001

(65) Prior Publication Data

US 2003/0097748 A1 May 29, 2003

(51) Int. Cl.$^7$ ............................................. B23P 21/00
(52) U.S. Cl. ........................... 29/783; 29/739; 29/742; 29/793; 29/794; 29/729; 198/586; 198/817
(58) Field of Search ........................ 29/739, 740, 784, 29/742, 729, 783, 825, 827, 832, 840, 794, 797; 198/586, 817, 619, 346.2; 414/404, 416.12, 719

(56) References Cited

U.S. PATENT DOCUMENTS

| | | | | |
|---|---|---|---|---|
| 4,301,958 A | * | 11/1981 | Hatakenaka et al. | 228/4.5 |
| 4,348,276 A | * | 9/1982 | Tateishi et al. | 209/573 |
| 4,631,812 A | * | 12/1986 | Young | 29/714 |
| 5,549,716 A | * | 8/1996 | Takahashi et al. | 29/25.01 |

* cited by examiner

*Primary Examiner*—Carl J. Arbes
*Assistant Examiner*—Minh Trinh
(74) *Attorney, Agent, or Firm*—Ostrolenk, Faber, Gerb & Soffen, LLP

(57) ABSTRACT

Apparatus for the manufacture of a component such as an integrated circuit chip, including: a plurality of processing stations forming a production line for the manufacture of the component, a conveyor adapted to transport component forming materials from one processing station to another in the production line, and a storage on the production line for storing the materials during transport along the production line. The storage acts as buffers effectively to collect materials and store them for efficient transport along the production line.

17 Claims, 7 Drawing Sheets

APPARATUS FOR ASSEMBLING INTEGRATED CIRCUIT PACKAGES

FIELD OF THE INVENTION

The present invention relates to an apparatus used for the assembly of a semiconductor device such as an Integrated circuit ("IC") package, and in particular to an apparatus that automates the assembly process.

BACKGROUND AND PRIOR ART

Typically, the manufacture of an IC package from the raw-material stage to the finished product involves a plurality of processes. In the case of leadframe packages, semiconductor die is first bonded to a leadframe by a bonding agent. Thereafter, the leadframe is heated in a curing oven to strengthen the bond between the die and the leadframe. The bonding pads of the die and the load frame are then bonded to each other for conductivity by means of wire-bonding, commonly using gold or copper wires. The die is thereafter encapsulated with a resin material, which is molded over the die and leadframe. The resin material is then cured by heating before each encapsulated die is singulated from the other dies in the leadframe by a so-called trim-and-form machine or singulation machine. Each IC package that is so formed is then collected and sent to customers.

Conventionally, each apparatus for die-bonding, wire-bonding, molding and/or singulation is a stand-alone machine that is dedicated to its task, such as a mechanized die-bonder for die-bonding or wire-bonder for wire-bonding. This practice resulted in islands of similar equipment separated from one another. In order to transfer each set of leadframes processed by one stand-alone machine to the next machine, the leadframes processed by one machine are inserted into magazines and manually transported to another machine for the next stage of the production process. Thus, there is a need for large buffering between the processes through the use of leadframe magazines, and manual material handling and tracking, This is inefficient, and requires special maintenance staff and a number of skilled operators to operate each stand-alone machine.

Efforts have been made in the industry to automate the process to some extent by reducing manual transfer of leadframes. To do so, a conveying mechanism may be interspersed between stand-alone machines to form a transportation system for leadframe strips. The strips are transported to each of the various stand-alone machines required for the manufacturing process using conveyor belts. An example of such an implementation is described in U.S. Pat. No. 5,549,716 for "Process for Manufacturing Integrated Circuits using an Automated Multi-Station Apparatus including an Adhesive Dispenser and Apparatus therefore". A conveyor belt is utilized for transferring the leadframes between a die-bonder, wire-bonder and molding machine, and for the process to be executed on a through-line.

However, although the multi-station apparatus described therein reduces the need for manual transfer of leadframes during the assembly process, it fails to optimize the advantages of automation, For example, the resulting apparatus does not cater to the fact that certain processes, such as wire-bonding, typically take a longer time than other processes, such as molding. In the event, bottlenecks are caused because a process further down the production line has to wait whilst an earlier process is being performed. Since the machines in the aforesaid patent are quite rigidly integrated in their implementation, it will also be more difficult to change machines in the production line with minimal modifications to the apparatus as a whole.

Thus, there is a desire to reduce some of the aforementioned problems with the prior art by promoting flexible integration between various machines in the production line, and at the same time, allowing the flow of materials along the production line to be managed more efficiently.

SUMMARY OF THE INVENTION

It is thus an object of the present invention to provide an improved apparatus that can improve the management of the flow of materials in production line.

According to the invention, there is provided an apparatus for the manufacture of a component such as an integrated circuit chip, including: a plurality of processing stations forming a production line for the manufacture of said component; conveying means adapted to transport component forming materials from one processing station to another in the production line: and storage means of the production line for storing said materials during transport along the production line.

Using the invention, it is possible to improve the flow through use of storage devices, such as buffers. It is therefore possible to improve efficiency, yield and quality, as will be apparent in the preferred embodiment of the invention described below.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

DETAILED DESCRIPTION OF PREFERRED EMBODIMENTS OF THE INVENTION

Figure 1:
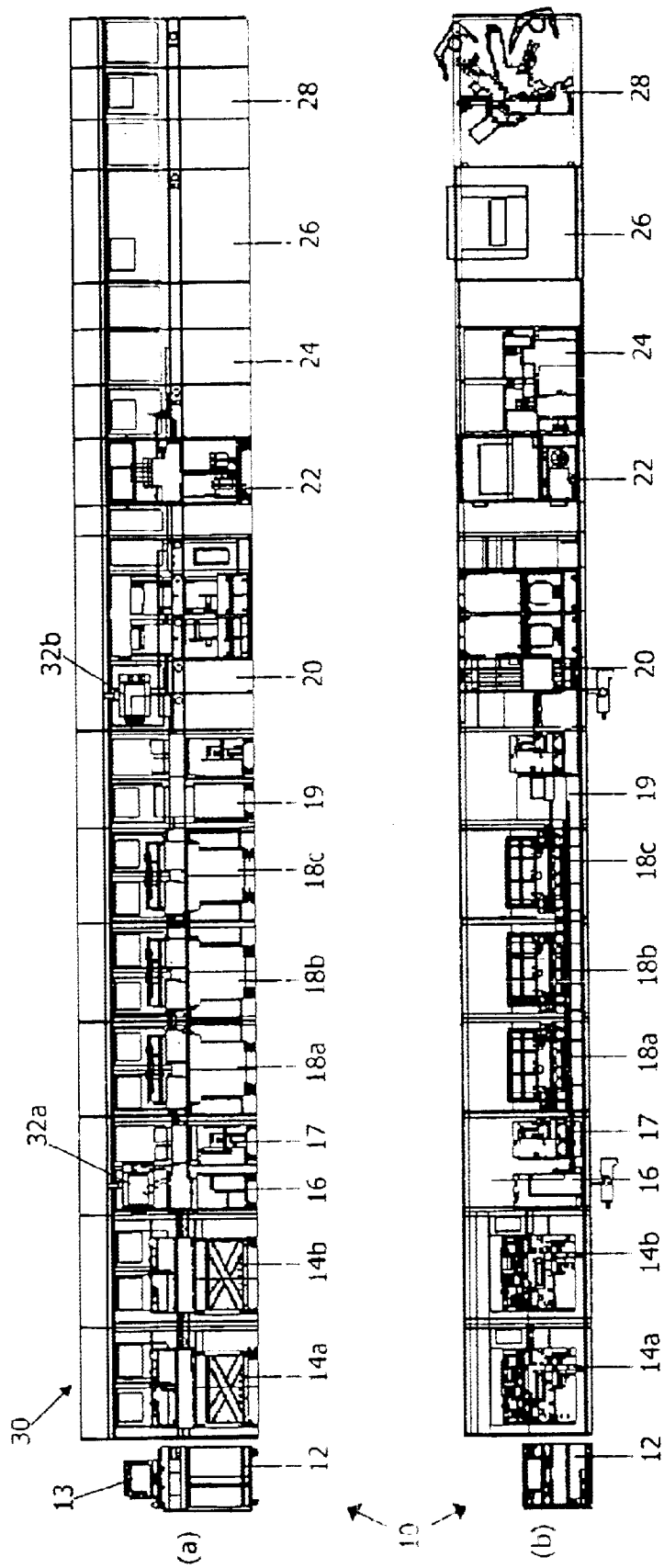
FIG. 1 illustrates at 1(a) a front and it 1(b) a plan elevation view respectively of an IC assembly apparatus according to a preferred embodiment of the invention.

FIG. 1 at 1(a) and 1(b) illustrates a front elevation and a plan view respectively of an IC assembly apparatus according to a preferred embodiment of the invention. The illustrations show a cell controller 12 that includes a microprocessor, and display screen 13 to monitor and control the processes taking place in the production line constituting the apparatus 10 for processing materials, for example, to produce a semiconductor leadframe package. The cell controller 12 can be positioned anywhere, although in this embodiment, it is positioned adjacent to the production line. The first machine in the apparatus 10 is a die-bonder 14a, 14b to place and bind a die to a semiconductor leadframe (not shown). After die-bonding, the die and leadframe are cured in a cure oven 16 and then enter an input buffer 17.

The input buffer 17 controls the entry of leadframes to wire bonders 18a, 18b, 18c. The leadframes then enter into an output buffer position 19, to control the entry of leadframes into a mold link 20 and molding machine 22 from the wire-bonders. The IC chips are then molded with resin material and the leadframes may thereafter be transported to a trim and form machine 24 and then tested in a strip test machine 26. Finished products may then be transferred onto tape/reels in a tape/reel machine 28 and packaged for delivery.

Figure 2:
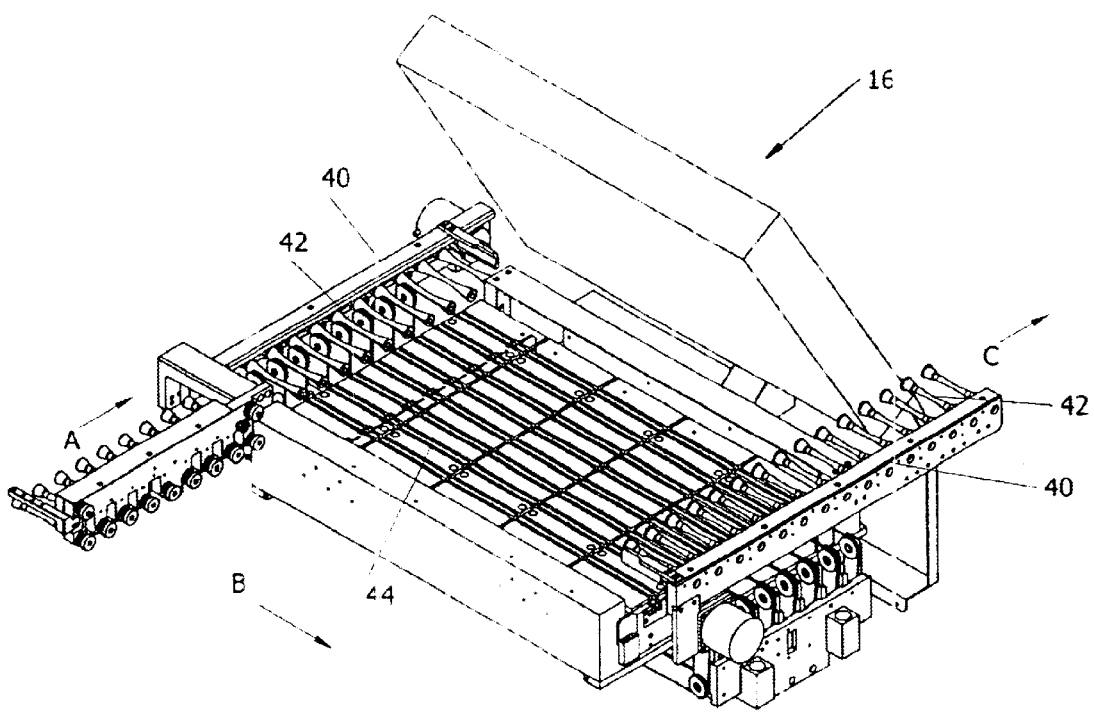
FIG. 2 is an isometric view of a cure oven of the apparatus of FIG. 1.

The modules of the entire production line may be encased within one or more compartments 30. The compartments 30 serve to isolate and to keep the immediate production environment within the compartments 30 clean, without having to maintain the same level of cleanliness outside the compartment, Typically, it is desirable that the cleanliness level in the production environment is maintained at 1,000 particles of 0.5 microns or smaller per cubic meter of air or better. In the illustrated embodiment, each module 14a, 14b, 16, 17, 18a, 18b, 18c, 19, 20, 22, 24, 26 and 28 of the apparatus 10 is enclosed within an individual compartment, although all the modules can also be housed in one single enlarged compartment. It should be appreciated that the modules comprising the apparatus may be differently configured. Thus, the number of die-bonders 14, wire-bonders 18, molds 22, trim and form machine 24, strip tester 26 and so on within the apparatus 10 can be increased or decreased according to operational requirements. This can be done by removing or inserting a module or machine in the apparatus 10 and reorienting as appropriate. The apparatus 10 is thus modular The die-bonders 14a, 14b are not described in detail as they may consist of any die-bonding machine wherein IC chips are placed and affixed to leadframes by the use of adhesives or other method, FIG. 2 is an isometric view of a cure oven 16 of the apparatus of FIG. 1. Leadframes that have been affixed with IC chips enter into the cure oven via direction A. The leadframes rest on rollers 42 of a line transporter 40, which are the primary means by which leadframes are transferred from machine to machine. The rollers 42 are rotated via a pulley system (not shown), and by rotation, they carry the leadframes along the length of the line transporter 40. Once the leadframes are in line with the width of the cure oven 15, each leadframe is led through heated cells 44 in direction B to cure the adhesives binding the die to the leadframe. At the other end of the cure oven 16, there is another set of rollers 42 to carry the processed leadframes in direction C along the line transporter 40. The leadframes are thus conveyed to the next module in the production line, which is the input buffer 17.

Figure 3A:
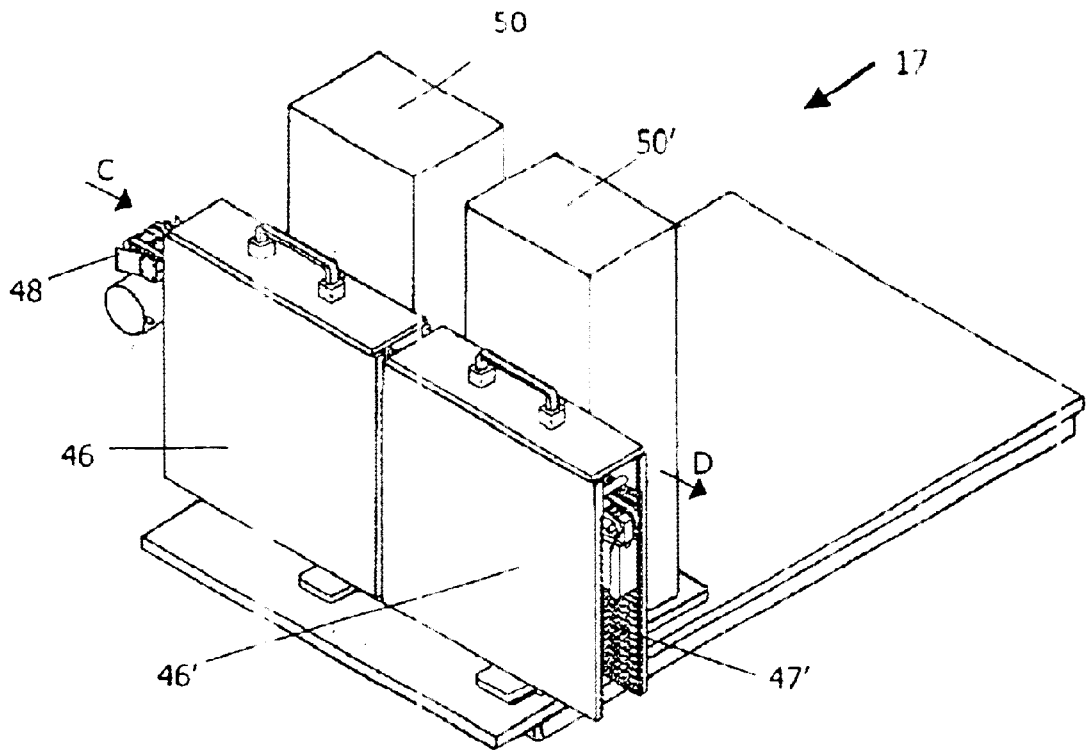
FIGS. 3(a) and 3(b) are isometric views of respectively two possible configurations of an input buffer of the apparatus of FIG. 1.
Figure 3B:
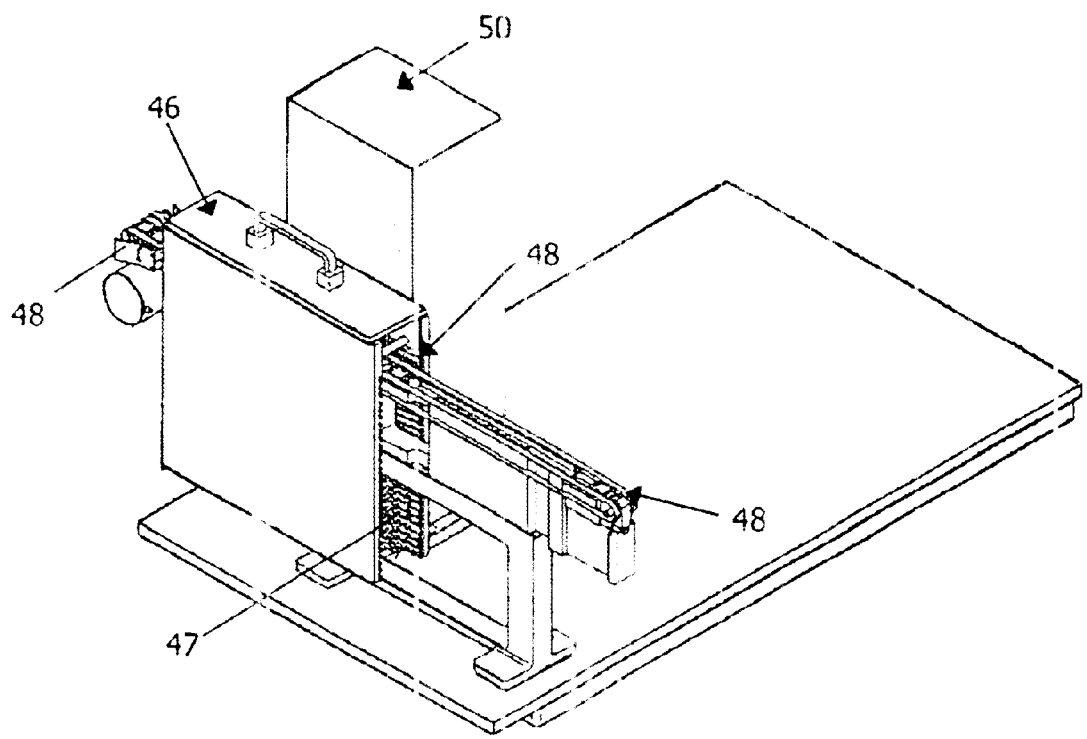
Figure 4:
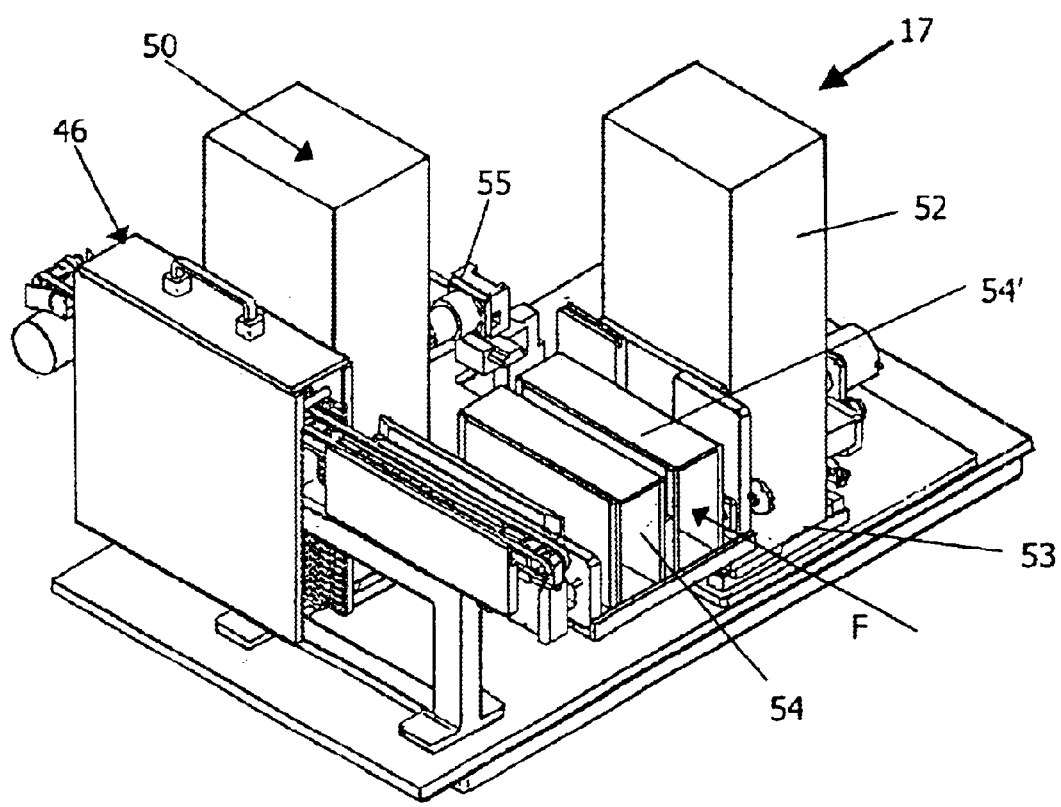
FIG. 4 is an isometric view of another possible configuration of the input buffer.

FIGS. 3(*a*) and 3(*b*) and FIG. 4 represent isometric views of possible alternative configurations of an input buffer 17 of the apparatus of FIG. 1. The function of the input buffer 17 is to store leadframes whereby flow of leadframes may be controlled, for example, when the wire-bonders 18a, 18b, 18c are occupied with current load, and the die bonders 14a, 14b continue to generate processed leadframes for wire-bonding. The rate of extraction or release of leadframes can be automatically determined and controlled by the microprocessor of the cell controller 12, depending on the output at the various processing stations.

Turning to FIG. 3(*a*), the Input buffer 17 acts as an intermediate storage location to control output from the die-bonders 14 and cure oven 16 to the wire-bonders 18 and is strategically placed to regulate the flow of materials across the production line. The input buffer 17 Includes one or more magazines 46, 46' for storage of leadframes. Leadframes are brought into the region of the input buffer 17 in direction C and rest on a belt transfer mechanism 48 comprising rollers driving a pair of spaced-apart rubber conveying tracks. The magazines 46, 46' are each individually attached to a lifter mechanism 50, 50' that may be raised or lowered, thus raising or lowering the magazines 46, 46'. Each magazine 46, 46' has specially cut slots 47, 47' to accommodate leadframes. The height of the lifter mechanism 50, 50' is indexed so that the position of the belt transfer mechanism is indexed to the corresponding slots 47, 47' in the magazines 46, 46'.

The belt transfer mechanism 48 passes through the slots 47, 47' of the two magazines 46, 46' and essentially transfers leadframes from the cure oven 16 to the line transporter 40. The leadframes pass right through the slots 47, 47' when there is no need for the leadframes to be stored. In order to retain a leadframe in either magazine 46, 46', insertion of leadframes will start from the top slot of the magazine 46, 46'. The belt transfer mechanism 48 stops the leadframe in the slot 47, 47' of the magazine 46, 46' which it is to be stored The lifter mechanism 50, 50' lifts that magazine 46, 46' by one slot position, leaving the belt transfer mechanism 48 in line with the next slot position. Successive leadframes are captured in each magazine slot in the same manner until all the slots 47, 47' of a magazine 46, 46' are filled, if necessary, To remove leadframes from the magazines 46, 46', the reverse order is applied such that the lifter mechanism 50, 50' is lowered incrementally and successively until all the leadframes are conveyed away from the magazine 46, 46' towards the wire-bonder 18a, 18b, 18c in direction D. The bottom side of each magazine 46, 46' is open, so that a magazine of leadframes can be removed by an operator by lifting the magazine 46, 46' vertically away from the belt transfer mechanism 48 after the magazine 46, 46' is disengaged from the corresponding lifter mechanism 50, 50'. FIG. 3(*b*) shows the same configuration as FIG. 3(*a*), except that only one magazine 46 is deployed and thus the second magazine 46' and lifter mechanism 50' have been removed.

FIG. 4 shows another possible configuration of the input buffer 17 wherein the buffer includes a rear lifting mechanism 52 controlling a pair of distal or rear magazines 54, 54'. The rear lifting mechanism 52 is similar to the lifting mechanisms 50, 50' used for the front magazines 46, 46'. However, it also sits on a Y-sliding mechanism 53 so that either of the two rear magazines 54, 54' can be shifted to register with a rear track 56 of the line transporter 40. Leadframes are transferred from the line transporter 40 to each rear magazine 54, 54' by a blasing device, such as a roller mechanism and kicker mechanism (not shown). Once the leadframe is in place, the rear magazine 54, 54' is lifted by one slot position to accept the next leadframe. When the leadframe is to be transferred out of the rear magazine 54, 54', it is ejected by an ejector back into the read track of the line transporter 40. The rear magazine 54, 54' is then lowered in reverse manner to the loading process. It will be appreciated that any one of the configurations of the input buffer 17 may be placed at any suitable location along the production line and need not be located between the cure oven 16 and wire-bonder 18. Indeed, the output buffer 19 may have the same configuration as the input buffer 17 as described above. This can save costs and is more efficient as the buffer design can simply be duplicated and located at other points along the production line as required.

An advantage of the front magazines 46, 46' is that they are in line with the transportation highway, such that there is almost no waiting time for storing or releasing the leadframes from the buffer. Alternatively, the belt transfer mechanism may simply roll the leadframe through the magazine and not utilize the magazines 46, 46' if there is no buffering required. An advantage of the rear magazines 54, 54' is not only that buffer storage space is increased, but also that extraneous transfer mechanisms are minimized and yet allows quick storage and release of leadframes from the input buffer 17 to the next machine. The twin magazines 54, 54' further provides for dual lot storage for different leadframe requirements.

Figure 5:
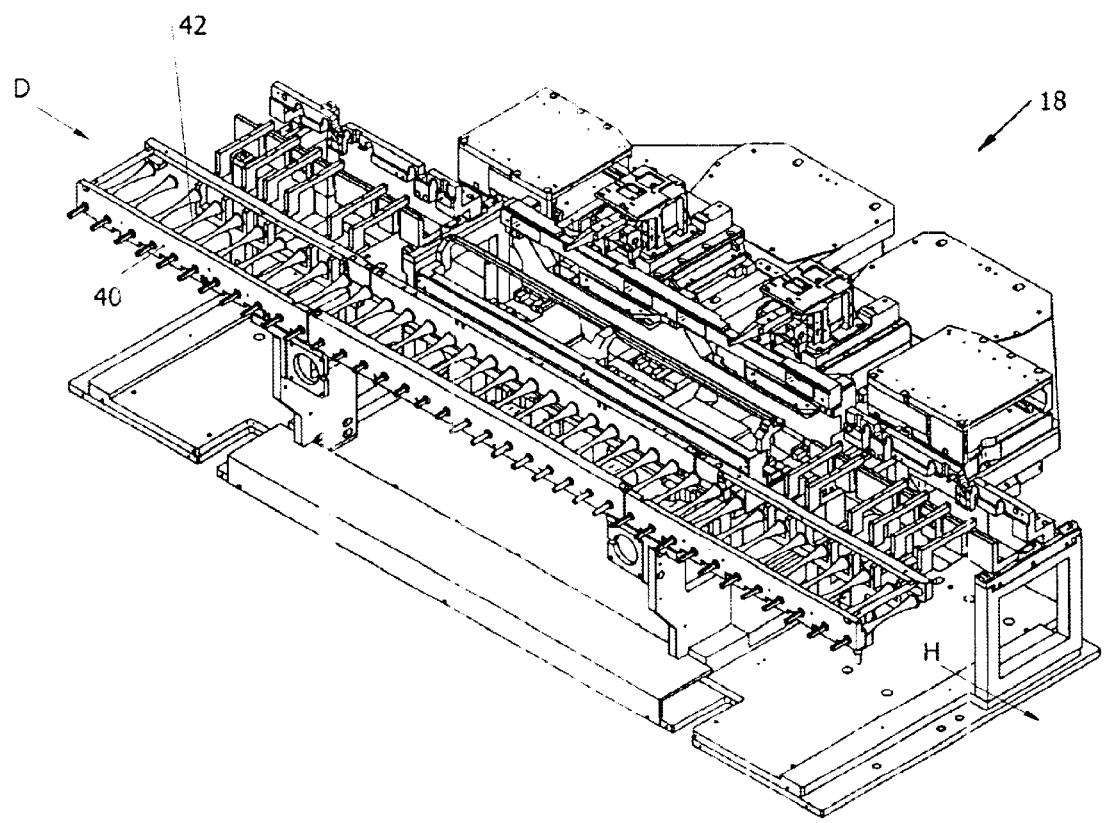
FIG. 5 is an isometric view of a wire-bonder and line transporter of the apparatus of FIG. 1.
Figure 6:
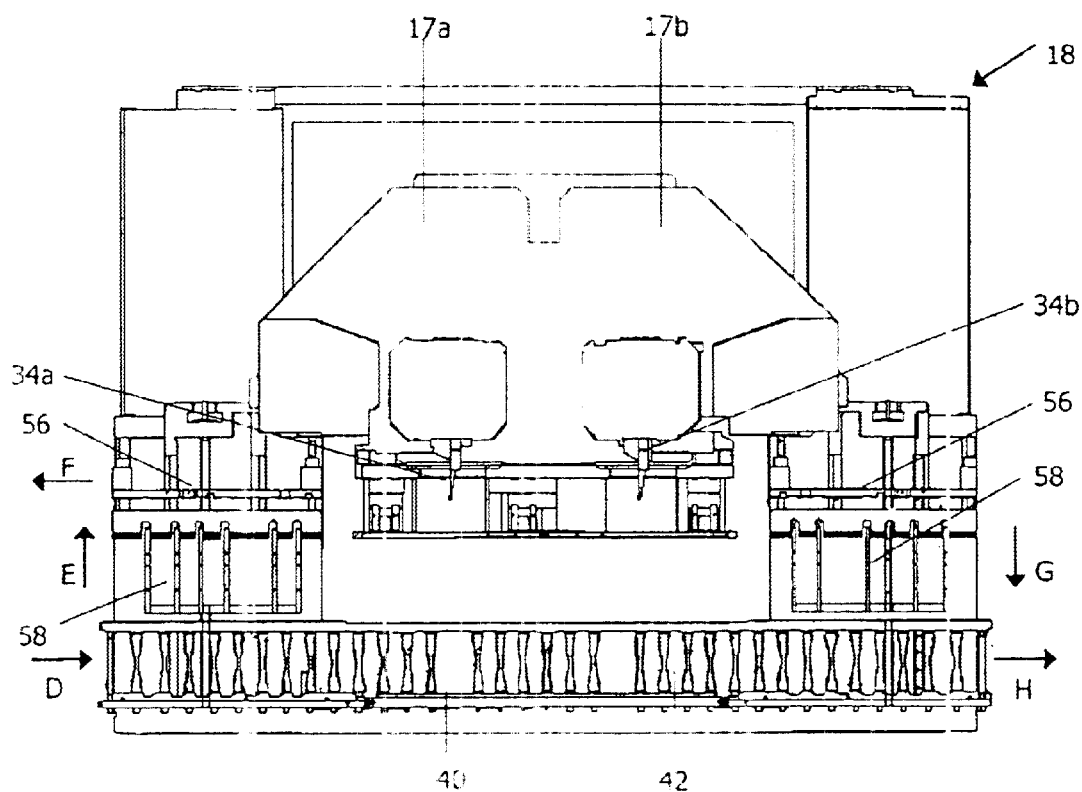
FIG. 6 is a plan view of the wire-bonder and line transporter illustrated in FIG. 5.

FIG. 5 is an isometric view and FIG. 6 is a plan view of a wire-bonder 18 and line transporter 40 of the apparatus of FIG. 1. In the embodiment of the invention described in FIG. 1, there are three wire-bonders 18a, 18b, 18c. Leadframes, after they have been oven-cured and passed through the input buffer 17, enter the line transporter 40 from direction D in FIG. 5. The line transporter 40 defines a first conveying path, whereas a rear track 56 of the line transporter defines a second conveying path that is parallel to the first conveying path. The rollers 42 of the line transporter 40 will draw leadframes onto the first portion of the line transporter 40, on the first conveying path whereupon each leadframe may be lifted and carried over to the rear track 56 on the second conveying path by a lifting means, in the form of a transfer arm 58. The rear track 56 is capable of two-directional movement, i.e. forwards and rearwards movement. Once on the rear track 56, each leadframe may proceed forwards towards the wire-bonding device 17a, 17b, or may travel rearwards in direction F to distal buffer magazines 54, 54' of the input buffer 17 (see FIG. 4) for buffering.

If the leadframes proceed to the wire-bonding devices 17a, 17b, the contacts of the dies will be wire-bonded to the leadframes using, inter alia, ultrasonic transducers 34a, 34b. Thereafter, the leadframes are transported to the end of the wire-bond transporter 40 beyond the second wire-bonding device 17b. The leadframe is then transported by another multiple-fingered transfer arm 58 from the rear track 56 back to the line transporter 40. The leadframes are then transported away from the wire-bonder 18 to the mold link 20 and molding machine 22 via direction H. In the described embodiment, an output buffer 19 is included between the wire-bonder 13 and the mold link 20 to control the flow of leadframes therebetween. The design of the output buffer 19 is similar to that of the input buffer 17 described above, except that, with reference to FIG. 4, the rear magazines 54, 54' are accordingly shifted to the left to be adjacent to the wire-bond transporter to the right of the wire-bonder 18c, and other supporting mechanisms are reversely oriented. The buffer design has been elaborated on above and will not be repeated.

Figure 7:
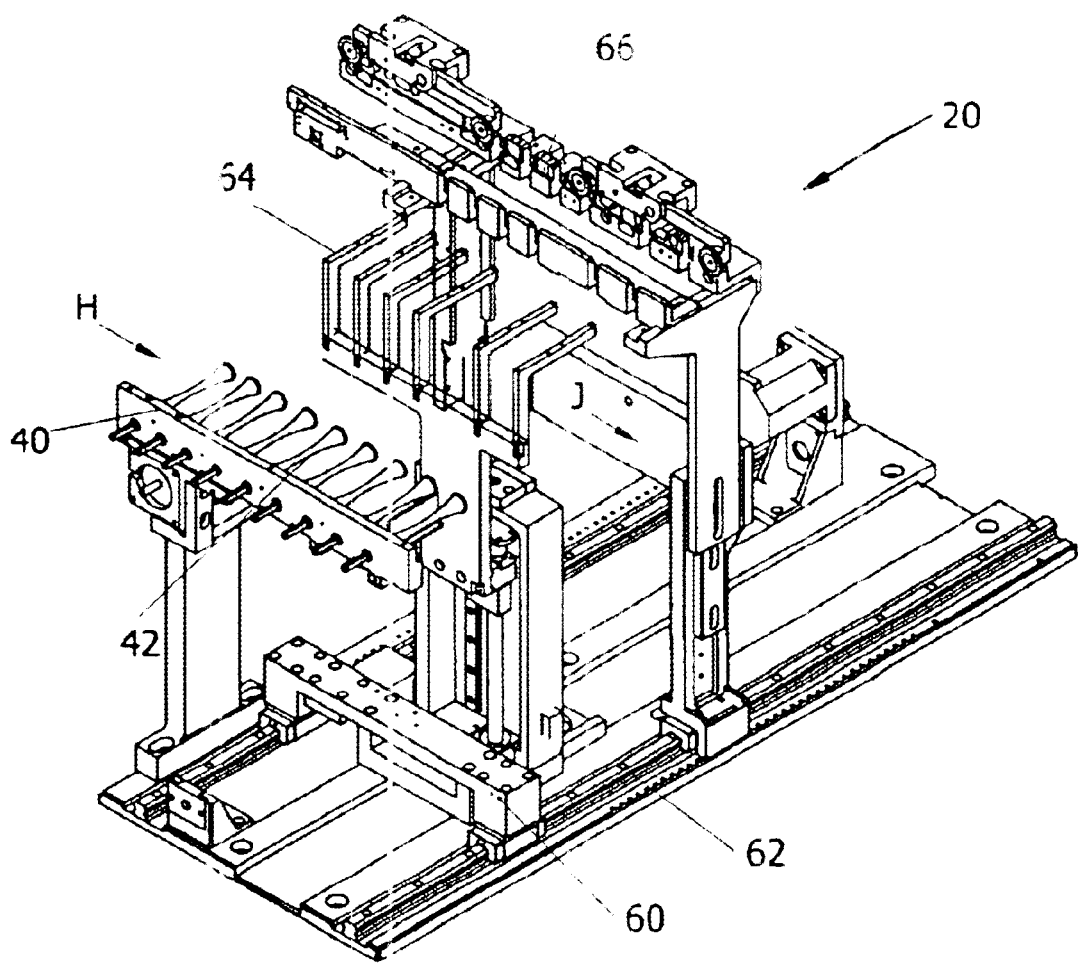
FIG. 7 Is an isometric view of a mold link of the apparatus of FIG. 1.

FIG. 7 is an isometric view of a mold link 20 of the apparatus of FIG. 1. Leadframes that have been processed by the wire-bonders 18a, 18b, 18c are led into the mold link 20 via an output buffer 19 in direction 11 and are pushed by the rollers 42 to rest on the line transporter 40. A guide means 60 is drivable along a guide rail 62. The drivable guide means 60 carries with it a multiple-fingered lifting means 64. The guide means 60 can be driven from a position below the rollers 42 at one end of its travel path, and to a position adjacent a conveyor track 66 at the other end of its travel path. The guide means 60 bring the lifting means 64 to a position below the rollers 42. When a leadframe rests on the rollers 42, the lifting means 64 is raised until it lifts the leadframe over the rollers 42. Thereafter, the guide means 60 is driven to a position adjacent the conveyor track 66. Along the way, the lifting means 64 is raised above the level of the conveyor track 66 during the movement. When the lifting means 64 is above the conveyor track 66 and is subsequently lowered, the leadframe will rest on the conveyor track 66. The leadframe is then transported towards the molding machine 22 in direction J by roller grips (not shown). The molding machine may be one that is known in the art and will not be described in detail.

Referring again to FIG. 1, after the leadframes pass through the molding machine 22 and the dies are encapsulated with resin material, the leadframe packages are singulated using a trim and form machine 24. The leadframes are tested in a strip test machine 26 and finally packed into tapes and reels in a tape/reel machine 28. Thus, the whole process from the die-bonding to strip testing and packing is fully automated.

It would be appreciated that the embodiment of the invention described hereinbefore with reference to the drawings provides fast cycle time, minimum work in process in transit and real-time monitoring of performance. Whilst the modules are modular, they are tightly coupled and easily configurable. With greater assimilation, the size of the buffers is reduced, and their use made more flexible. The integration allows automatic material and information flow at an optimal level. The whole production and buffering process may be controlled by a suitably-programmed microprocessor of the cell controller 12.

The invention described herein is susceptible to variations, modifications and/or additions other than those specifically described and it is to be understood that the invention includes all such variations, modifications and/or additions which fall within the spirit and scope of the above description.

What is claimed is:

1. An apparatus for the manufacture of an integrated circuit component, including:
   a plurality of processing stations forming a production line for the manufacture of said component;
   conveying means including a first conveying path adapted to transport materials from one processing station to another in the production line and a second conveying path, said materials being transferable from the first conveying path to the second conveying path; and
   storage means of the production line for storing said materials during transport along the production line;
   wherein the storage means includes least one distal magazine positioned adjacent the second conveying path to receive said materials conveyed towards the distal magazine.

2. The apparatus according to claim 1, including storage means positioned adjacent the conveying means that is operable selectively to extract said materials being processed from the conveying means for storage, and thereafter to release said materials from storage for further processing by a processing station of the production line.

3. The apparatus according to claim 2, wherein the rate of at least one of extraction and/or release of materials from the storage means is automatically adjustable by a microprocessor according to the rate of processing of materials at various processing stations.

4. The apparatus according to claim 2, wherein the storage means is situated along the direction of travel of the materials and extracts material from the conveying means by displacement of the storage means relative to the conveying means.

5. The apparatus according to claim 1, wherein the second conveying path is adapted selectively to convey said materials in a forwards or rearwards direction and the distal magazine forward of the second conveying path and/or to the rear of it.

6. The apparatus according to claim 5, wherein two or more distal magazines are operatively connected to a shifting device, which is capable of shifting either of the distal magazines into alignment with the second conveying path for receiving materials.

7. The apparatus according to claim 1, wherein the conveying means includes a biasing device to urge materials into the distal magazine from the second conveying path or to urge materials onto the second conveying path.

8. The apparatus according to claim 1, comprising lifting means to transfer the materials between the first conveying path and the second conveying path.

9. The apparatus according to claim 8, wherein the transfer means is a transfer arm that can lift and relay an item of material between the first and second conveying paths.

10. The apparatus according to claim 1, wherein the conveying means comprises of a plurality of rollers on which materials are carried, controlled by a pulley system urging materials along the route of transportation.

11. The apparatus according to claim 1, wherein the conveying means comprises a pair of belts on which said materials are carried.

12. The apparatus according to claim 1, which includes a cell controller including a microprocessor to monitor and control movement of said materials along the conveying means and processing stations.

13. The apparatus according to claim 1, wherein the processing stations include any one or more or the following devices: die-bonder, cure oven, wire-bonder, mold link, molding machine, trim and form machine, strip tester and tape/reel machine.

14. The apparatus according to claim 1, wherein each processing station is housed within a compartment having a space segregated from air outside the compartment and which maintains air within the compartment cleaner than air outside the compartment.

15. The apparatus according to claim 1, wherein the storage means is located between a die-bonder and a wire-bonder.

16. The apparatus according to claim 1, wherein the storage means is located between a wire-bonder and a moulding machine.

17. The apparatus according to claim 1, wherein the second conveying path comprises a rear track of a wire-bonder that is operative to move the material towards a wire-bonding device.

* * * * *